US008030143B2

(12) United States Patent
Lin et al.

(10) Patent No.: US 8,030,143 B2
(45) Date of Patent: Oct. 4, 2011

(54) METHOD OF FORMING A DISPLAY DEVICE BY USING SEPARATE MASKS IN FORMING SOURCE AND DRAIN REGIONS OF MOS TRANSISTORS

(75) Inventors: Tsung-Yen Lin, Tainan (TW); Chih-Hung Peng, Gongguan Township, Miaoli County (TW); Chien-Peng Wu, Longjing Township, Taichung County (TW); Shan-Hung Tsai, Taichung (TW); Yi Chun Yeh, Taipei (TW)

(73) Assignee: TPO Displays Corp. (TW)

( * ) Notice: Subject to any disclaimer, the term of this patent is extended or adjusted under 35 U.S.C. 154(b) by 170 days.

(21) Appl. No.: 12/468,510

(22) Filed: May 19, 2009

(65) Prior Publication Data
US 2009/0289541 A1    Nov. 26, 2009

(30) Foreign Application Priority Data
May 23, 2008  (TW) ................................ 97119110 A

(51) Int. Cl.
*H01L 21/00*  (2006.01)
*H01L 21/84*  (2006.01)
(52) U.S. Cl. ......................... 438/154; 438/149; 438/164
(58) Field of Classification Search ................... 438/154
See application file for complete search history.

(56) References Cited

U.S. PATENT DOCUMENTS

| 7,227,187 | B2 * | 6/2007 | Hotta | ............................... 257/64 |
| 7,256,457 | B2 * | 8/2007 | Hotta | ............................. 257/347 |
| 7,348,631 | B2 * | 3/2008 | Hotta | ............................. 257/344 |

* cited by examiner

*Primary Examiner* — Matthew Smith
*Assistant Examiner* — Michael Jung
(74) *Attorney, Agent, or Firm* — Lowe Hauptman Ham & Berner, LLP

(57) ABSTRACT

A method of forming a display device is provided. The method includes the following steps: providing a substrate which includes a driving circuit region and a pixel region; forming a first island and a second island in the driving circuit region on the substrate with a semiconductor material; performing a first ion implantation process to dope ions into both of the first island and the second island; forming a first patterned mask on the substrate to cover the second island and expose a part of the first island; performing a second ion implantation process by using the first patterned mask as a mask to form a first source/drain region in the first island; removing the first patterned mask; forming a first gate and a second gate on the first island and the second island respectively; forming a second patterned mask on the substrate to cover the first island and expose a part of the second island; and performing a third ion implantation process by using both of the second patterned mask and the second gate as a mask to form a second source/drain region in the second island. The first island, the first source/drain region, and the first gate form a NMOS device, and the second island, the second source/drain region, and the second gate form a PMOS device.

18 Claims, 6 Drawing Sheets

METHOD OF FORMING A DISPLAY DEVICE BY USING SEPARATE MASKS IN FORMING SOURCE AND DRAIN REGIONS OF MOS TRANSISTORS

CROSS-REFERENCE TO RELATED APPLICATIONS

This application claims priority to Taiwan Patent Application No. 97119110 entitled "DISPLAY DEVICE AND METHOD OF FORMING THE SAME, AND ELECTRONIC DEVICE HAVING THE SAME", filed on May 23, 2008, which is incorporated herein by reference and assigned to the assignee herein.

FIELD OF INVENTION

The present invention relates to a method of forming a display device, and more particularly to a method of forming a display device capable of reducing the number of photomasks required for the fabrication process.

BACKGROUND OF THE INVENTION

Low Temperature Polycrystalline Silicon technology has been widely used in fabricating thin film transistor liquid crystal display (TFT-LCD) devices. Typically, a thin film transistor includes a channel region formed by a polysilicon layer. For forming a polysilicon layer during the TFT-LCD process, an amorphous silicon layer is first formed on a substrate and then an excimer laser annealing process is performed to enable amorphous silicon layer to be transformed into a polysilicon layer.

FIGS. 1A and 1B are cross-sectional diagrams illustrating the TFT-LCD process of manufacturing a display device in accordance with prior art. Referring to FIG. 1A, a substrate 120 is provided, which includes a driving circuit region 100 and a pixel region 110. Next, a nitride layer 130 and an oxide layer 132 are formed on the substrate. Next, a polysilicon island 140 corresponding to a NMOS device and a polysilicon island 142 corresponding to a PMOS device are formed in the driving circuit region 100, and a polysilicon island 144 is formed in pixel region 110. Typically, the method of forming the polysilicon islands 140, 142, and 144 may include, for example, the following steps: forming an amorphous silicon layer; performing an excimer laser annealing process to recrystallize the amorphous silicon layer into a polysilicon layer; and performing the conventional photolithographic and etching process on the polysilicon layer to form the polysilicon islands 140, 142, and 144.

Next, a NMOS channel-doping step is performed to adjust a threshold voltage of the formed NMOS device. Referring to FIG. 1B, a patterned mask 150 is formed on the substrate 120 to cover the polysilicon island 142 by using a photomask (not shown). Next, an ion implantation step 160 is performed to implant ions (such as Boron ions) into the polysilicon islands 140 and 144 by using the patterned mask 150 as a mask. Generally, the ion implantation process performed in the NMOS channel-doping step 160 has an energy of 10 KeV to 15 KeV.

It can be known from the above description with reference to the accompanying drawings that, in the conventional TFT-LCD process, one photomask is required to form a mask layer to cover the PMOS device before performing the NMOS channel-doping step. Therefore, both the process time and cost are increased.

Therefore, it is desired to have a method of forming a display device capable of reducing the required number of the photomasks without affecting yield.

SUMMARY OF THE INVENTION

In light of the problems of the prior art, the present invention provides a method of forming a display device, which can reduce the number of the photomasks required for the fabrication process and therefore reduce the process cost.

According to one embodiment of the present invention, a method of forming a display device is provided. The method includes the following steps: providing a substrate having a driving circuit region and a pixel region; forming a first island and a second island in the driving circuit region on the substrate with a semiconductor material; performing a first ion implantation process to dope ions into both of the first island and the second island; forming a first patterned mask on the substrate to cover the second island and expose a part of the first island; performing a second ion implantation process by using the first patterned mask as a mask to form a first source/drain region in the first island; removing the first patterned mask; forming a first gate and a second gate on the first island and the second island respectively; forming a second patterned mask on the substrate to cover the first island and expose a part of the second island; and performing a third ion implantation process by using both of the second patterned mask and the second gate as a mask to form a second source/drain region in the second island. The first island, the first source/drain region, and the first gate form a NMOS device, and the second island, the second source/drain region, and the second gate form a PMOS device.

According to another embodiment of the present invention, a method of forming a display device is provided. The method includes the following steps: providing a substrate having a driving circuit region and a pixel region; forming a first polysilicon island and a second polysilicon island in the driving circuit region on the substrate, and forming a pixel polysilicon island in the pixel region on the substrate; performing a first ion implantation process to dope ions into all of the first polysilicon island, the second polysilicon island, and the pixel polysilicon island; forming a first patterned mask on the substrate to cover the second polysilicon island and expose a part of the first polysilicon island and a part of the pixel polysilicon island; performing a N-type ion implantation process by using the first patterned mask as a mask to form a first source/drain region in the first polysilicon island and form a pixel source/drain region and a lower electrode in the pixel polysilicon island; removing the first patterned mask; forming a first gate and a second gate on the first polysilicon island and the second polysilicon island respectively, and forming a pixel electrode and an upper electrode on the pixel polysilicon island; forming a second patterned mask on the substrate to cover the first polysilicon island and the pixel polysilicon island and expose a part of the second polysilicon island; and performing a P-type ion implantation process by using both of the second patterned mask and the second gate as a mask to form a second source/drain region in the second polysilicon island.

According to still another embodiment of the present invention, an electronic device is provided. The electronic device includes a display device formed by the above-described method and an input unit coupled to the display device for controlling display of the display device.

The other aspects of the present invention, part of them will be described in the following description, part of them will be apparent from description, or can be known from the execution of the present invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The invention will now be further described by way of example only with reference to the accompany drawings in which.

DETAILED DESCRIPTION OF THE PREFERRED EMBODIMENTS

The present invention discloses a method of forming a display device, which can reduce the number of photomasks without affecting yield and therefore can cut cost and raise profit. The present invention will be described more fully hereinafter with reference to the FIGS. 2A-4. However, the devices, elements, and methods in the following description are configured to illustrate the present invention, and should not be construed in a limiting sense.

In the present invention, each layers on the substrate can be formed by the methods well known by those skilled in the art, such as deposition process, chemical vapor deposition process, atomic layer deposition (ALD) process, etc.

Figure 1A:
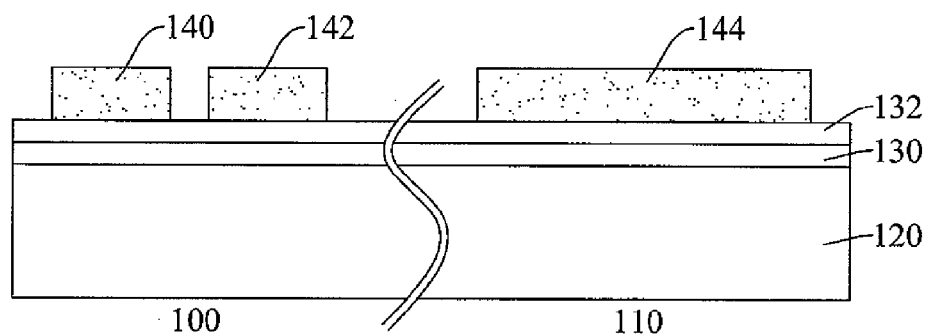
FIGS. 1A and 1B are cross sectional diagrams showing a TFT-LCD process of forming a display device according to prior art.
Figure 1B:
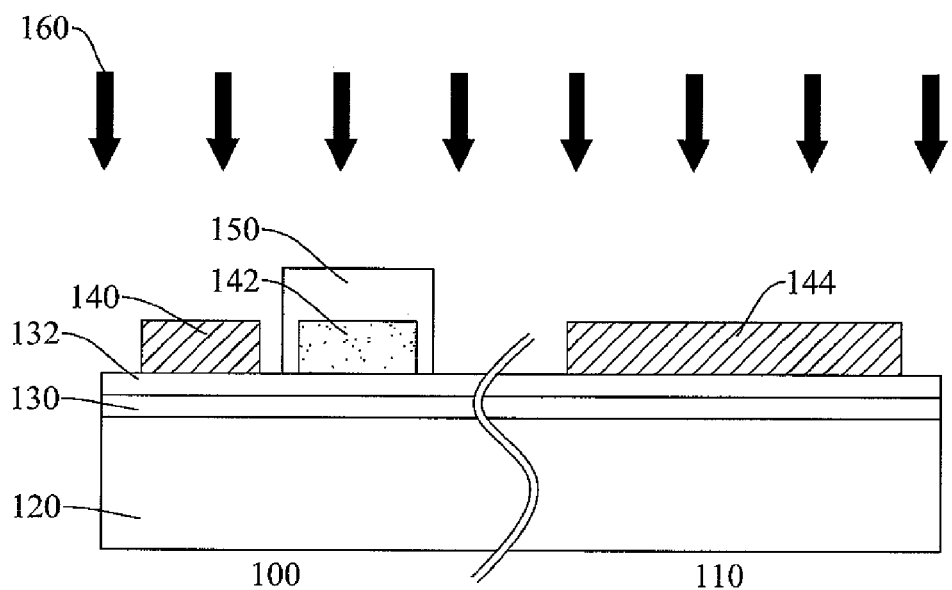
Figure 2A:
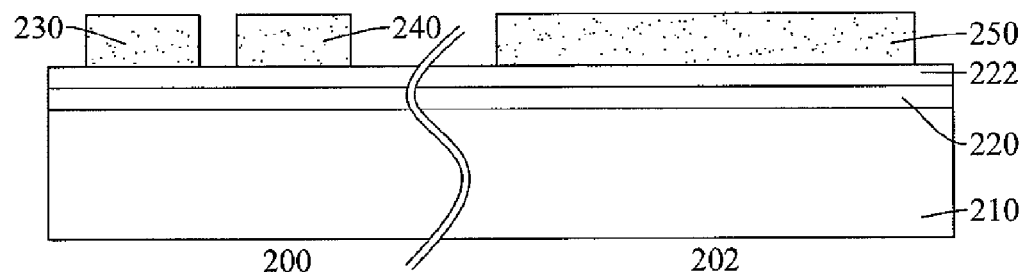
FIGS. 2A-2H are flowcharts, in cross-sectional views, illustrating the TFT-LCD process of manufacturing a display device in accordance with an embodiment of the present invention.

FIGS. 2A-2H are flowcharts, in cross-sectional views, illustrating the TFT-LCD process of manufacturing a display device in accordance with an embodiment of the present invention. Referring to FIG. 2A, in one embodiment of the present invention, a substrate 210, which can be an insulating substrate (such as a glass substrate or a plastic substrate) is provided. The substrate 210 includes a driving circuit region 200 and a pixel region 202. Next, a nitride layer 220 and an oxide layer 222 are formed on the substrate 210. For achieving the desired purposes, such as protecting the substrate 210 from being etched, the thicknesses of the nitride layer 220 and the oxide layer 222 may be varied depending on the adopted process.

Next, above the oxide layer 222, the polysilicon islands 230 and 240 are formed in the driving circuit region 200 and a polysilicon island 250 is formed in the pixel region 202. In this embodiment, a NMOS device will be formed on the basis of the polysilicon island 230, and a PMOS device will be formed on the basis of the polysilicon island 240. The method of forming the polysilicon islands 230, 240, and 250 includes the known deposition process, photolithography process, etching process, and excimer laser annealing process. For example, the polysilicon islands 230, 240, and 250 can be formed by the following steps: forming an amorphous silicon layer (not shown) by using a chemical vapor deposition (CVD) process; recrystallizing the amorphous silicon layer into a polysilicon layer by using an excimer laser annealing process; coating a photoresist layer on the polysilicon layer; patterning the photoresist layer by a pattern transferring technique (such as exposure and development processes) to define respective locations of the polysilicon islands; and etching the polysilicon layer by using the patterned photoresist layer as a mask to formed the polysilicon islands 230, 240, and 250. In other embodiments, the islands 230, 240, and 250 can also be formed by other semiconductor material.

Figure 2B:

Next, a channel-doping step is performed to adjust threshold voltages of the NMOS device and the PMOS device simultaneously. Referring to FIG. 2B, an ion implantation process 260 is performed to implant ions into the polysilicon islands 230, 240, and 250. In one embodiment of the present invention, the ion implantation process 260 is performed by implanting boron ions at an energy between 10 and 15 KeV. Boron ions are implanted into the polysilicon islands 230, 240, and 250 simultaneously during the ion implantation process 260 to form the channel regions of the NMOS device and the PMOS device, and therefore it doesn't require an additional photomask to form a patterned mask layer covering the polysilicon island 240.

Figure 2C:
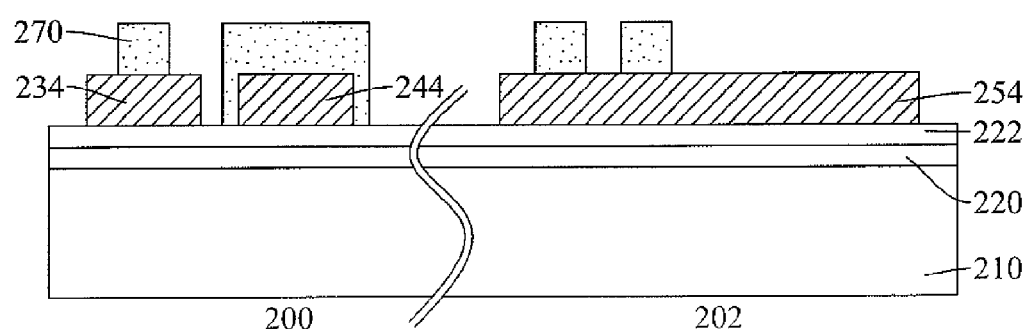
Figure 2D:
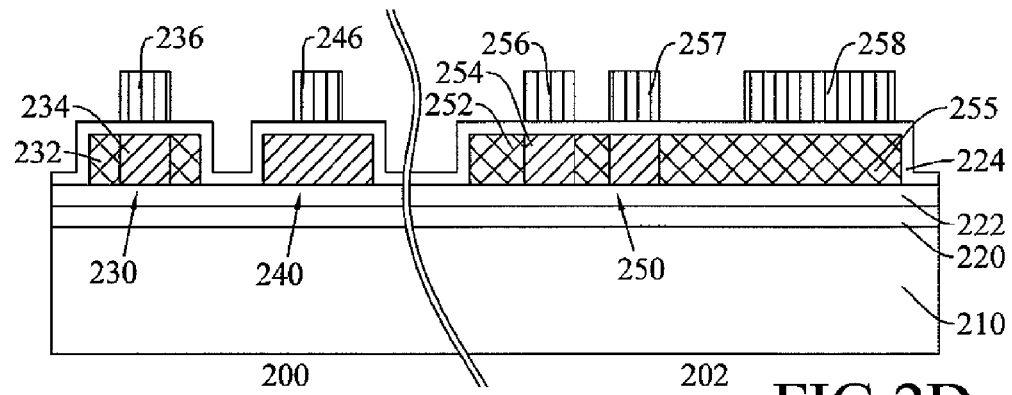

Referring to FIG. 2C, a patterned mask 270 is formed on the substrate 210 to cover the polysilicon island 240 and define locations of the drain/source region of the NMOS device and the lower electrode of the capacitor. For example, the patterned mask 270 can be formed of conventional photoresist materials, and then patterned by the conventional spin coating and photolithography process. Next, an ion implantation process 262 is performed by using the patterned mask 270 as a mask to form a source/drain region 232 and a channel region 234 in the polysilicon island 230 (as shown in FIG. 2D), and form a source/drain region 252, a channel region 254, and a lower electrode 255 in the polysilicon island 250 (as shown in FIG. 2D). As shown in FIGS. 2B and 2C, the channel regions 234 and 254 are formed after the ion implantation process 260. Next, the patterned mask 270 is removed. In this embodiment, the implanted ions are N-type ions, such as phosphorous ions or arsenic ions.

Next, referring to FIG. 2D, a gate insulating layer 224, such as silicon oxide or metal oxide, is formed conformally on the substrate 210. Next, gates 236 and 246 are formed on the polysilicon islands 230 and 240 respectively, and gates 256, 257 and an upper electrode 258 are formed on the polysilicon island 250. The gates 236, 246, 256, 257 and the upper electrode 258 can be formed of metal, polysilicon, doped polysilicon, and/or other appropriate conductive material, and can be formed by, for example, the following steps: forming a gate conductive layer (not shown) on the gate insulating layer 224, forming a patterned photoresist layer on the gate conductive layer to define locations of the gates and the upper electrode; and then etching the gate conductive layer by using the patterned photoresist layer as a mask.

Figure 2E:
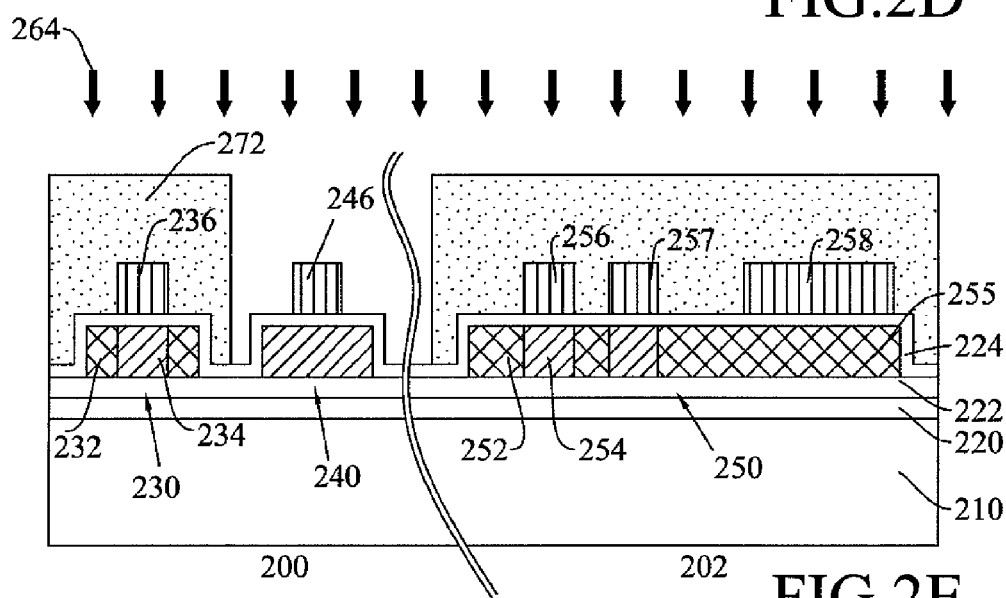
Figure 2F:
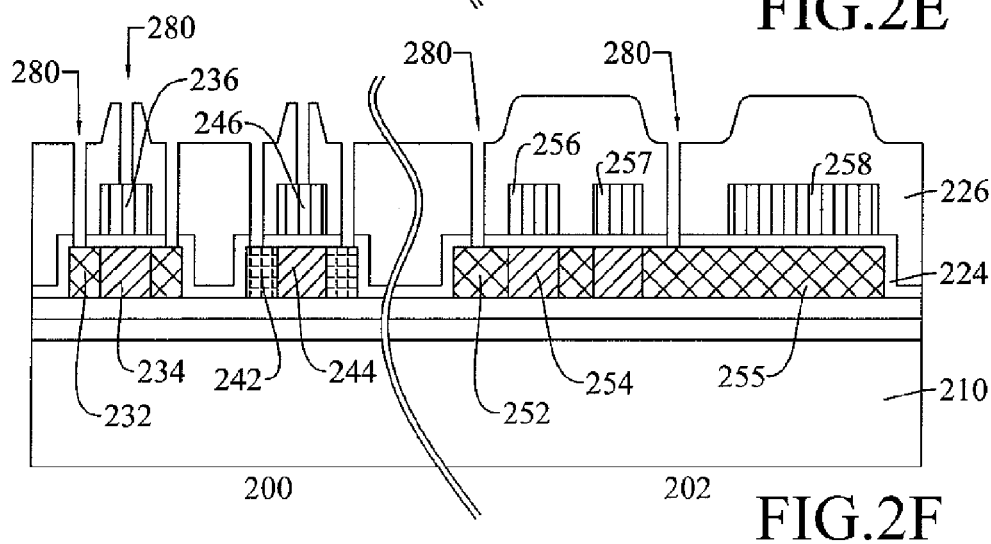

Referring to FIG. 2E, a patterned mask 272 is formed on the substrate 210 to cover the polysilicon islands 230, 250 and define locations of the source/drain region of the PMOS device. The material and manufacturing method of the patterned mask 272 are similar to that of the patterned mask 270. Next, an ion implantation process 264 is performed by using the patterned mask 272 as a mask to form a source/drain region 242 and a channel region 244 in the polysilicon island 240 (as shown in FIG. 2F), wherein the channel region 244 is formed after the ion implantation process 260 (referring to FIG. 2B). Next, the patterned mask 272 is removed. In this embodiment, the implanted ions are P-type ions, such as Boron ions. Consequently, the channel region 234, the source/drain region 232, and the gate 236 form a NMOS device, and the channel region 244, the source/drain region 242, and the gate 246 form a PMOS device.

Referring to FIG. 2F, after completing the ion implantation process, an insulating layer 226 is formed on the substrate 210 to cover all the devices on the substrate 210. The insulating layer 226 can be formed of silicon oxide, silicon nitride, or other insulating material by the conventional deposition process. Next, a plurality of contact openings 280 are formed to expose the source/drain regions 232, 242, 252, and gates 236, 246. The method of forming the contact openings 280 may include the following steps: coating a photoresist layer (not shown) on the insulating layer 226; patterning the photoresist layer by using the conventional photolithography process to define locations of the contact openings 280; and etching the insulating layer 226 and gate insulating layer 224 by using the patterned photoresist layer as a mask to form the contact openings 280.

Figure 2G:
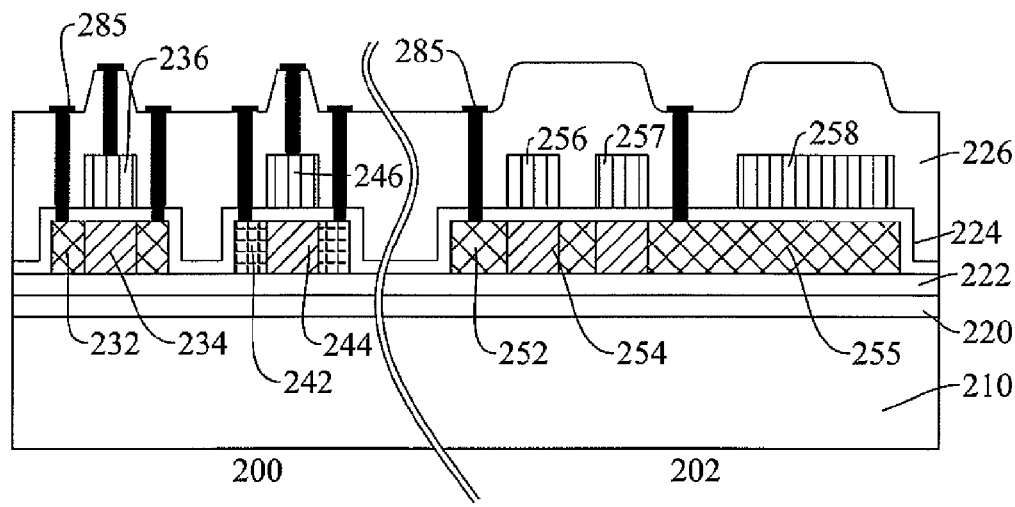

Referring to FIG. 2G, a conductive layer 285, which can be formed of metal, polysilicon, doped polysilicon, or other conductive material, is formed on the insulating layer 226 to cover the insulating layer 226 and fill the plurality of contact opening 280. Next, the conductive layer 285 is patterned by performing the photolithography and etching process to form a plurality of data lines which are electrically connected to the source/drain regions 232, 242, and 252 respectively and form a control line which is electrically connected to the gates 236 and 246.

Figure 2H:
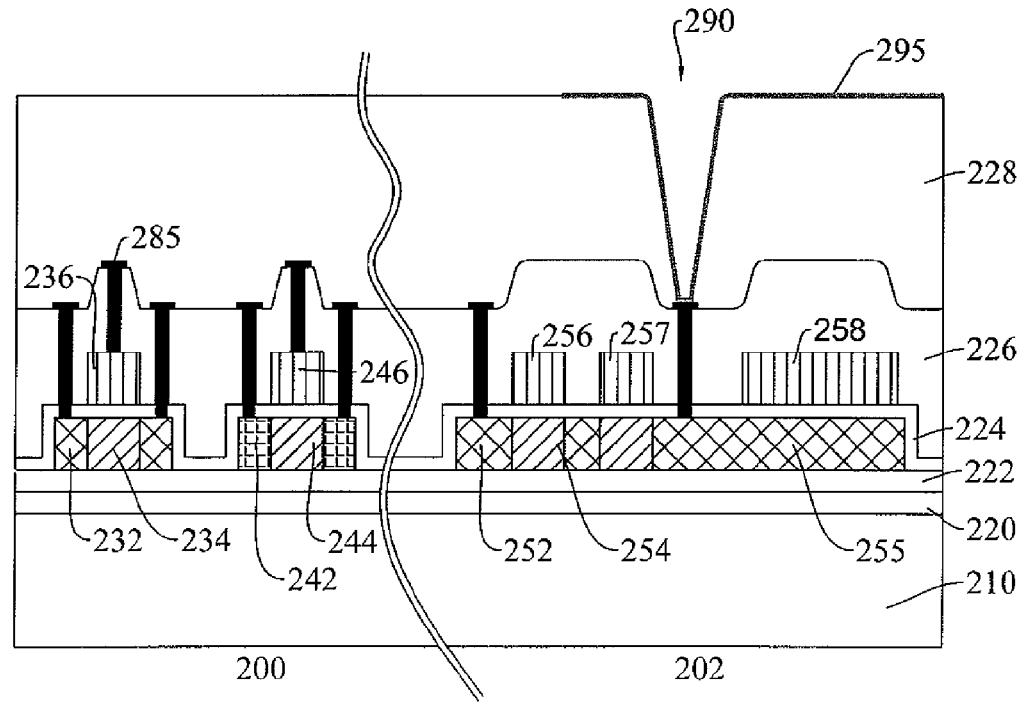

Referring to FIG. 2H, a dielectric layer 228 is formed on the substrate 210 to cover the insulating layer 226 and the conductive layer 285. Next, a polishing method, such as chemical mechanical polishing process, is performed for forming a planarized surface. Next, a via 290 is formed in the dielectric layer 228 by the conventional photolithography and etching process to expose a data line in the pixel region 202. Next, an ITO (indium tin oxide) layer is formed conformally on the dielectric layer 228 and within the via 290, and then a conventional photolithography and etching process is performed on the ITO layer to form a pixel electrode 295 electrically connected with a data line above the pixel region 202.

Figure 3A:
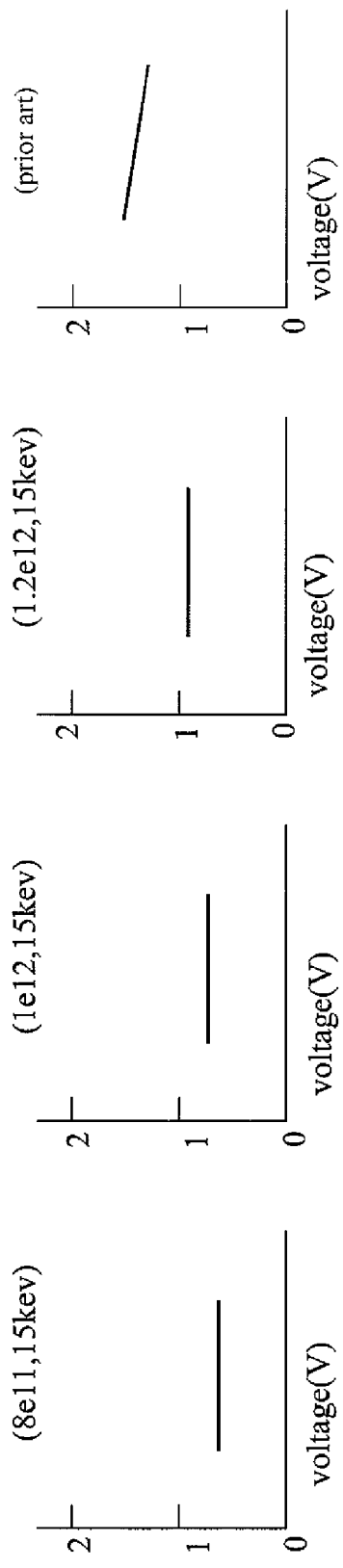
FIGS. 3A and 3B illustrate measurement data of threshold voltages of different NMOS transistors and different PMOS transistors which are implanted under different ion implantation conditions.
Figure 3B:
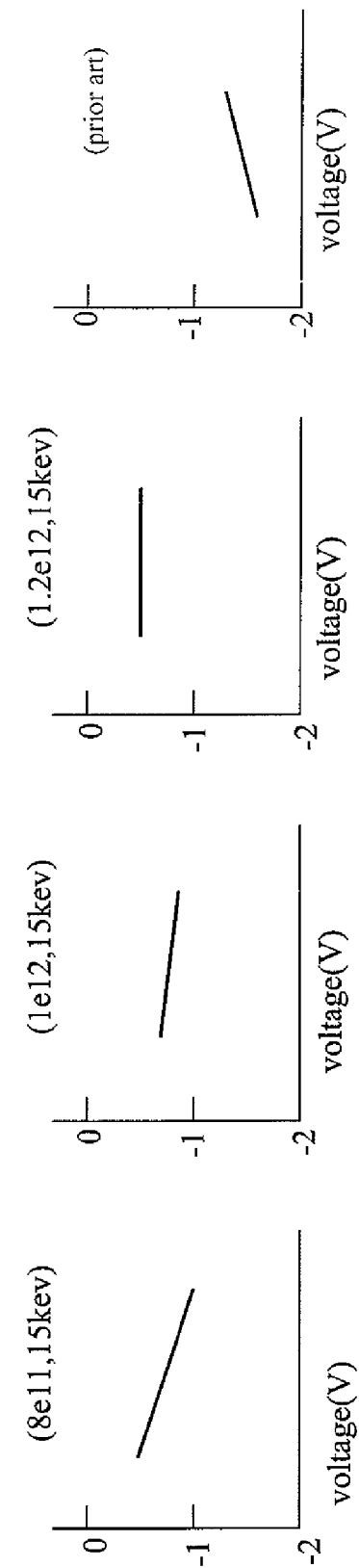

FIGS. 3A and 3B illustrate measurement data of threshold voltages of different NMOS transistors and different PMOS transistors, which are implanted under different ion implantation conditions in accordance with one embodiment of the present invention. FIGS. 3A and 3B also illustrate measurement data of threshold voltages of transistors formed by the conventional process on the right-most side of diagram as a reference. In this embodiment, the ion implantation is performed at an ion energy of 15 KeV. As shown in FIGS. 3A and 3B, the threshold voltage of NMOS device can be controlled between 0.5V and 1V, and the threshold voltage of PMOS device can be controlled between −0.5V and −1V. Generally, according to the industry standards of the current TFT-LCD process, the threshold voltage of NMOS device should be between 0.5V and 2.5V, and the threshold voltage of PMOS device should be between −0.5V and −2.5V. Therefore, it can be seen that the NMOS and PMOS devices formed by the method of the present invention can meet the requirement of the industry standard.

The method of the present invention can be applied to form various display devices, such as a liquid crystal display, an organic light emitting diode display (OLED), a plasma display, an organic electro-luminescence display (OELD), and other display devices formed by TFT-LCD process.

According to the method of forming a display device of the present invention, a photolithography step before the channel-doping step, which is required for the conventional process, can be omitted. The required characteristics of both the NMOS device and the PMOS device can be obtained simultaneously by using the concentrations and energies of the channel-doping step disclosed by the present invention. The method of the present invention reduces the number of photomasks required for the fabrication process, which can not only decrease process time and cost, but also improve competitiveness and productivity.

Figure 4:
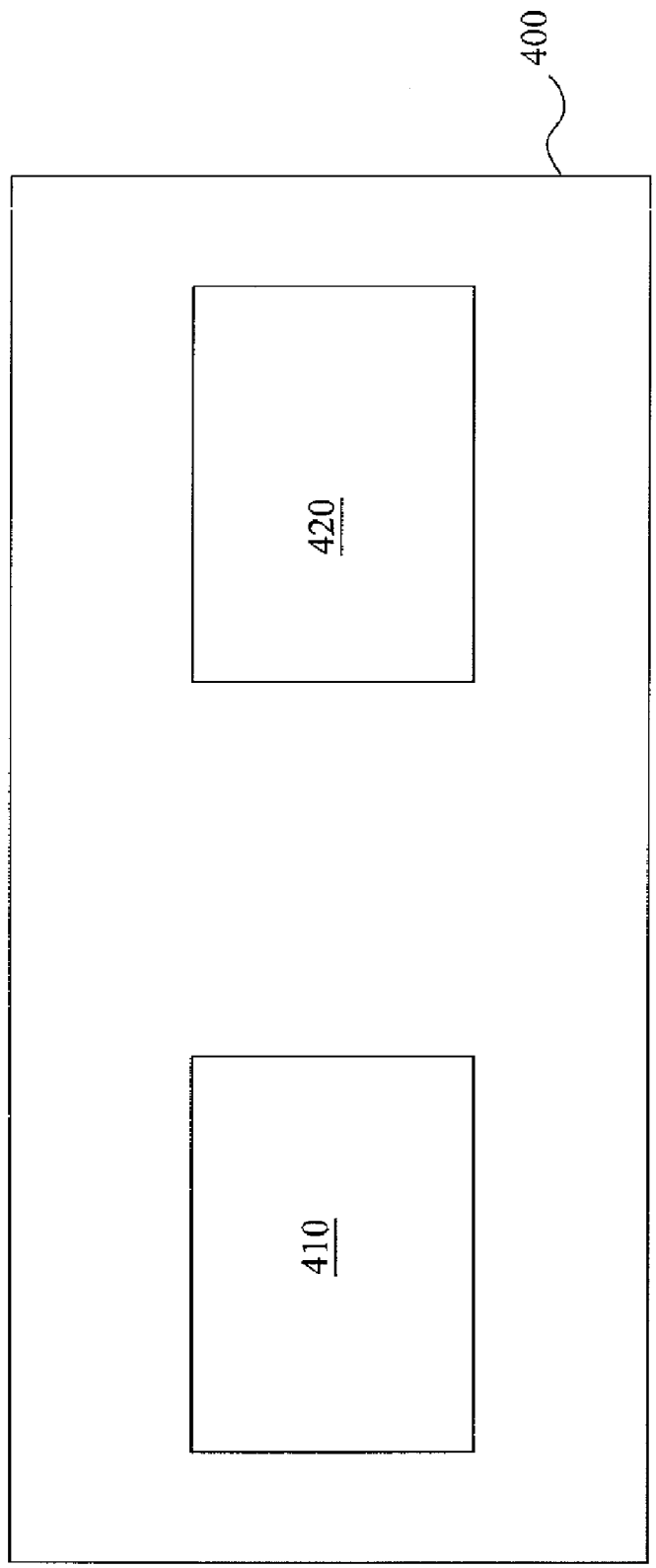
FIG. 4 shows an illustrative diagram of an electronic device in accordance with one embodiment of the present invention

FIG. 4 shows an illustrative diagram of an electronic device 400 in accordance with one embodiment of the present invention. As shown in FIG. 4, the electronic device 400 includes a display device 410 and an input unit 420. For example, the electronic device 400 can be a mobile phone, a digital camera, a personal digital assistant (PDA), a notebook computer, a desktop computer, a television, a car media player, an avionics display, a digital photo frame, a GPS device, or a portable video player. The display device 410 can be formed by the manufacturing process described accompanying FIGS. 2A-2H. In one embodiment, the display device 410 can be, for example, but not limited to, a liquid crystal display, an organic light emitting diode display (OLED), a plasma display, or an organic electro-luminescence display (OELD). Further, the input unit 420 is coupled to the display device 410, and the image displayed by the display device 410 can be controlled by inputting control signals into the display device 410 through the input device 420.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

We claim:

1. A method of forming a display device, comprising:
   providing a substrate having a driving circuit region and a pixel region;
   forming a first island and a second island in the driving circuit region on the substrate with a semiconductor material;
   performing a first ion implantation process to dope ions into both of the first island and the second island;
   forming a first patterned mask on the substrate to fully cover the second island and expose a part of the first island after performing the first ion implantation process;
   performing a second ion implantation process by using the first patterned mask as a mask to form a first source/drain region in the first island;
   removing the first patterned mask;
   forming a first gate and a second gate on the first island and the second island respectively after the first and second ion implantation processes have been performed;
   forming a second patterned mask on the substrate to cover the first island and expose a part of the second island; and
   performing a third ion implantation process by using both of the second patterned mask and the second gate as a mask to form a second source/drain region in the second island;
   wherein the first island, the first source/drain region, and the first gate form a NMOS device, and the second island, the second source/drain region, and the second gate form a PMOS device.

2. The method according to claim 1, wherein the first ion implantation process is performed by implanting boron ions at an energy between 10 KeV and 15 KeV.

3. The method according to claim 2, wherein a first channel region in the first island and a second channel region in the second island are formed respectively by the first ion implantation process.

4. The method according to claim 3, a threshold voltage of the NMOS device is about between 0.5V and 1V, and a threshold voltage of the PMOS device is about between −0.5V and −1V.

5. The method according to claim 2, wherein the step of forming the first and the second islands further comprising: forming an amorphous silicon layer on the substrate with the semiconductor material; patterning the amorphous silicon layer to form a first amorphous silicon island and a second amorphous silicon island; and performing an excimer laser annealing process to recrystallize the first and the second amorphous silicon islands into the first and the second islands respectively.

6. The method according to claim 5, further comprising the following steps before forming the amorphous silicon layer: forming a nitride layer on the substrate; and
   forming an oxide layer on the nitride layer.

7. The method according to claim 2, wherein the second ion implantation process is a N-type ion implantation process, and the third ion implantation process is a P-type ion implantation process.

8. The method according to claim 2, wherein the step of forming the first and the second gates comprising: conformally forming a gate insulating layer on the substrate; forming a gate conductive layer on the gate insulating layer; and patterning the gate conductive layer to form the first and the second gates on the first and the second islands respectively.

9. The method according to claim 2, wherein a third island in the pixel region is formed by the step of forming the first and the second islands; wherein a pixel source/drain region and a lower electrode in the third island is formed by the step of forming the first source/drain region; and wherein a pixel electrode and an upper electrode on the third island is formed by the step of forming the first and the second gates.

10. The method according to claim 1, wherein the display device comprises a liquid crystal display, an organic light emitting diode display (OLED), a plasma display, or an organic electro-luminescence display (OELD).

11. A method of forming a display device, comprising the following steps:
   providing a substrate having a driving circuit region and a pixel region;
   forming a first polysilicon island and a second polysilicon island in the driving circuit region on the substrate, and forming a pixel polysilicon island in the pixel region on the substrate;
   performing a first ion implantation process to dope ions into all of the first polysilicon island, the second polysilicon island, and the pixel polysilicon island;
   forming a first patterned mask on the substrate to fully cover the second polysilicon island and expose a part of the first polysilicon island and a part of the pixel polysilicon island after performing the first ion implantation process;
   performing a N-type ion implantation process by using the first patterned mask as a mask to form a first source/drain region in the first polysilicon island and form a pixel source/drain region and a lower electrode in the pixel polysilicon island;
   removing the first patterned mask;
   forming a first gate and a second gate on the first polysilicon island and the second polysilicon island respectively after the first ion implantation process and the N-type ion implantation process have been performed, and forming an upper electrode on the pixel polysilicon island;
   forming a second patterned mask on the substrate to cover the first polysilicon island and the pixel polysilicon island and expose a part of the second polysilicon island; and
   performing a P-type ion implantation process by using both of the second patterned mask and the second gate as a mask to form a second source/drain region in the second polysilicon island.

12. The method according to claim 11, wherein the first ion implantation process is performed by implanting boron ions at an energy between 10 KeV and 15 KeV.

13. The method according to claim 12, wherein a first channel region in the first polysilicon island and a second channel region in the second polysilicon island are formed respectively by the first ion implantation process.

14. The method according to claim 13, wherein the first polysilicon island, the first source/drain region, the first channel, and the first gate form a NMOS device, and a threshold voltage of the NMOS device ranges from about 0.5 V to about 1V; and wherein the second polysilicon island, the second source/drain region, the second channel, and the second gate form a PMOS device, and a threshold voltage of the PMOS device ranges from about −0.5V to about −1V.

15. The method according to claim 12, further comprising the following steps: forming an insulating layer on the substrate; forming a plurality of contact openings in the insulating layer to expose the first source/drain region, the second source/drain region, the pixel source/drain region, the first gate, and the second gate; forming a conductive layer on the insulating layer to fill the plurality of contact openings; patterning the conductive layer to form a plurality of data lines connecting with the first, second and pixel source/drain regions respectively; forming a dielectric layer on the substrate to cover the insulating layer and the conductive layer; forming a via in the dielectric layer to expose one of the data lines in the pixel region; forming a pixel electrode on the substrate, the pixel electrode electrically connecting with the data line in the pixel region through the via.

16. The method according to claim 15, wherein the step of forming the first polysilicon island, the second polysilicon island, and the pixel polysilicon island further comprising: forming an amorphous silicon layer on the substrate; patterning the amorphous silicon layer to form a first amorphous silicon island, a second amorphous silicon island, and a pixel amorphous silicon island; and performing an excimer laser annealing process to recrystallize the first amorphous silicon island, the second amorphous silicon island, and the pixel amorphous silicon island into the first polysilicon island, the second polysilicon island, and the pixel polysilicon island respectively.

17. The method according to claim 16, further comprising the following steps before forming the amorphous silicon layer: forming a nitride layer on the substrate; and
   forming an oxide layer on the nitride layer.

18. The method according to claim 11, wherein the display device comprises a liquid crystal display, an organic light emitting diode display (OLED), a plasma display, or an organic electro-luminescence display (OELD).

* * * * *